United States Patent
Wang

(10) Patent No.: US 12,501,593 B2
(45) Date of Patent: Dec. 16, 2025

(54) HEAT-DISSIPATING PLATES AND DISPLAY DEVICES

(71) Applicant: Wuhan China Star Optoelectronics Semiconductor Display Technology Co., Ltd., Hubei (CN)

(72) Inventor: Wenqiang Wang, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 251 days.

(21) Appl. No.: 18/270,253

(22) PCT Filed: Apr. 20, 2023

(86) PCT No.: PCT/CN2023/089477
§ 371 (c)(1),
(2) Date: Jun. 29, 2023

(87) PCT Pub. No.: WO2024/198009
PCT Pub. Date: Oct. 3, 2024

(65) Prior Publication Data
US 2025/0081420 A1     Mar. 6, 2025

(30) Foreign Application Priority Data
Mar. 28, 2023   (CN) .......................... 202310337313.5

(51) Int. Cl.
*H05K 7/20*       (2006.01)
*H01L 23/473*     (2006.01)

(52) U.S. Cl.
CPC ....... *H05K 7/20981* (2013.01); *H01L 23/473* (2013.01); *H05K 7/20254* (2013.01); *H05K 7/20272* (2013.01)

(58) Field of Classification Search
CPC ........... H05K 7/20254; H05K 7/20272; H05K 7/20327; H05K 7/20963; H05K 7/20981; H05K 7/2099
See application file for complete search history.

(56) References Cited

U.S. PATENT DOCUMENTS

| | | | |
|---|---|---|---|
| 6,597,113 B1 * | 7/2003 | Nitta .................. | H05K 7/20963 345/205 |
| 7,110,258 B2 * | 9/2006 | Ding ..................... | H01L 23/473 174/15.1 |

(Continued)

FOREIGN PATENT DOCUMENTS

| | | |
|---|---|---|
| CN | 104465562 | 3/2015 |
| CN | 109599375 | 4/2019 |

(Continued)

OTHER PUBLICATIONS

International Search Report and the Written Opinion Dated Jun. 28, 2023 From the International Searching Authority Re. Application No. PCT/CN2023/089477 and Its Translation Into English. (14 Pages).

*Primary Examiner* — Robert J Hoffberg

(57) ABSTRACT

Disclosed are a heat-dissipating plate and a display device, the heat-dissipating plate includes a heat-dissipating plate body; a heat-dissipating microcavity embedded in the heat-dissipating plate body; and a heat dissipation working medium filled inside the heat-dissipating microcavity. The heat-dissipating microcavity includes a heat absorption tank, a liquid collection tank arranged at intervals with the heat absorption tank, and a capillary micro channel group between the heat absorption tank and the liquid collection tank and communicating with the heat absorption tank and the liquid collection tank, and the capillary micro channel group includes a plurality of capillary micro channels arranged at intervals.

20 Claims, 6 Drawing Sheets

(56) References Cited

U.S. PATENT DOCUMENTS

| | | | |
|---|---|---|---|
| 2014/0090815 A1 | 4/2014 | Salamon et al. | |
| 2024/0074099 A1* | 2/2024 | Bauduin | H05K 7/20254 |
| 2024/0074107 A1* | 2/2024 | Bauduin | F28F 3/12 |
| 2024/0107707 A1* | 3/2024 | Blennius | H01Q 1/02 |

FOREIGN PATENT DOCUMENTS

| | | |
|---|---|---|
| CN | 113421864 | 9/2021 |
| CN | 216624286 | 5/2022 |
| CN | 216852857 | 6/2022 |
| CN | 114916193 | 8/2022 |

* cited by examiner

HEAT-DISSIPATING PLATES AND DISPLAY DEVICES

RELATED APPLICATIONS

This application is a National Phase of PCT Patent Application No. PCT/CN2023/089477 having International filing date of Apr. 20, 2023, which claims the benefit of priority of China Patent Application No. 202310337313.5 filed on Mar. 28, 2023. The contents of the above applications are all incorporated by reference as if fully set forth herein in their entirety.

TECHNICAL FIELD

The present disclosure relates to a field of display technology, and more particularly, to heat-dissipating plates and display devices.

BACKGROUND

With the development of foldable screen technology, consumers have put forward higher requirements for the performance of the whole foldable screen, such as environmental adaptability, use reliability, high service life, and the like. However, when the foldable screen mobile phone runs in large-scale games, multi-interface operations, or multi-software in parallel, the foldable screen mobile phone is inevitably required to be in a high power consumption state, and the heat dissipation problem caused by the high power consumption operation brings great challenges to the service life and reliability of the screen body and the chip. If the heat generated by the chip in the high-load operation state cannot be dissipated in time, the heat is prone to be transferred to a display element layer of the screen. If the light-emitting material inside the display element layer works in the high-temperature environment for a long time, the stability, efficiency, and service life of the light-emitting layer are greatly degraded, and even phenomena of black screen and bright spot occur, which finally causes the screen failure.

At the present stage, a copper foil is mainly used for heat dissipation to solve the heat dissipation problem of the foldable screen, but due to the fact that the density of the copper foil is too large, it is prone to lead a large specific gravity of a module, which is not conducive to a light and thin design of the foldable screen mobile phone. Moreover, as the power of the screen driving chip becomes higher and higher, the heat dissipation efficiency of the copper foil cannot further meet the use requirements.

SUMMARY

The present disclosure provides a heat-dissipating plate and a display device, and the heat-dissipating plate may solve a problem of low heat dissipation efficiency.

To realize the above functions, the technical solutions provided in the embodiments of the present disclosure are as follows:

EMBODIMENTS OF THE PRESENT DISCLOSURE

There is provided a heat-dissipating plate including:
a heat-dissipating plate body;
a heat-dissipating microcavity embedded in the heat-dissipating plate body; and
a heat dissipation working medium filled in the heat-dissipating microcavity and circularly flowing in the heat-dissipating microcavity.

The heat-dissipating microcavity includes a heat absorption tank, a liquid collection tank arranged at intervals with the heat absorption tank, and a capillary micro channel group between the heat absorption tank and the liquid collection tank and communicating with the heat absorption tank and the liquid collection tank, the capillary micro channel group includes a plurality of capillary micro channels arranged at intervals, the plurality of capillary micro channels includes a plurality of first capillary micro channels and a plurality of second capillary micro channels, the first capillary micro channels constitute a first capillary micro channel group, the second capillary micro channels constitute a second capillary micro channel group, a liquid inlet end of any one of the first capillary micro channels abuts and communicates with the heat absorption tank, a liquid outlet end of the any one of the first capillary micro channels abuts and communicates with the liquid collection tank, a liquid inlet end of any one of the second capillary micro channels abuts and communicates with the liquid collection tank, and a liquid outlet end of the any one of the second capillary micro channels abuts and communicates with the heat absorption tank.

Alternatively, any one of the capillary micro channels includes a plurality of sub-flow-sections sequentially communicated with each other, each of the sub-flow-sections includes:
a main channel;
at least two branch channels, an end of each of the at least two branch channels independently abutting and communicating with an end of the main channel away from the liquid inlet end, and extending in a direction away from the main channel; and
a reservoir chamber abutting and communicating with an end of each of the at least two branch channels away from the main channel;
an inner diameter of each of the at least two branch channel is less than an inner diameter of the main channel.

Alternatively, in two adjacent sub-flow-sections, a reservoir chamber of one of the two adjacent sub-flow-sections abuts and communicates with a main channel of another of the two adjacent sub-flow-sections.

Alternatively, a ratio of a cross-sectional area of each of the at least two branch channels to a cross-sectional area of the main channel is (0.4-0.6):1.

Alternatively, each of the sub-flow-sections further includes an olive-type channel abutting and communicating with the end of the main channel away from the liquid inlet end, the olive-type channel is provided with one distributary island, the distributary island divides the olive-type channel into two branch channels and one reservoir chamber, and the two branch channels extend from an end of the distributary island adjacent to the main channel along edges of opposite sides of the distributary island to an end of the distributary island away from the main channel and communicate with the reservoir chamber.

Alternatively, in any of the capillary micro channels, in any one of the capillary micro channels, lengths of the main channels decrease gradually in a direction from the liquid inlet end toward the liquid outlet end.

Alternatively, the end of the distributary island away from the main channel has a concave portion recessed toward the main channel.

Alternatively, in two adjacent capillary micro channels, olive-type channels in one of the two adjacent capillary micro channels and olive-type channels in another of the two adjacent capillary micro channels are arranged in a staggered manner.

Alternatively, any one of the capillary micro channels extends in a first direction, and the capillary micro channels are sequentially arranged at intervals in a second direction, the first direction is at a predetermined angle to the second direction.

Alternatively, the liquid collection tank includes a first liquid collection tank and a second liquid collection tank spaced apart from the first liquid collection tank in the second direction, the first liquid collection tank abuts and communicates with a liquid outlet end of each of the first capillary micro channels, the second liquid collection tank abuts and communicates with a liquid inlet end of each of the second capillary micro channels, wherein the heat-dissipating microcavity further includes a connecting tube, the connecting tube includes a first connecting sub-tube and a second connecting sub-tube in communication with each other, an inner diameter of the first connecting sub-tube decreases gradually and an inner diameter of the second connecting sub-tube increases gradually along a direction from the first connecting sub-tube toward the second connecting sub-tube, the first liquid collection tank and the second liquid collection tank communicates with each other through the connecting tube, the first liquid collection tank abuts and communicates with the first connecting sub-tube, and the second liquid collection tank abuts and communicates with the second connecting sub-tube.

Alternatively, the number of the second capillary micro channels is greater than the number of the first capillary micro channels.

Alternatively, the liquid collection tank includes one first liquid collection tank and two second liquid collection tanks, the two second liquid collection tanks are located at both ends of the first liquid collection tank respectively, one of the two second liquid collection tanks abuts and communicates with liquid inlet ends of a part of the second capillary micro channels, and another of the two second liquid collection tanks abuts and communicates with liquid inlet ends of a remaining part of the second capillary micro channels.

Alternatively, the heat-dissipating microcavity further includes a buffer tank disposed between a liquid outlet end of each of the second capillary micro channels and the heat absorption tank, one end of the buffer tank abuts and communicates with the liquid outlet end of each of the second capillary micro channels, another end of the buffer tank communicates with the heat absorption tank through the connecting tube, the buffer tank abuts and communicates with the first connecting sub-tube, and the heat absorption tank buts and communicates with the second connecting sub-tube.

Alternatively, the heat dissipation working medium diffuses to a liquid inlet end of each of the first capillary micro channels after absorbing heat in the heat absorption tank, flows to the liquid outlet ends via the first capillary micro channels, and are collected in the liquid collection tank, and the heat dissipation working medium collected in the liquid collection tank flows to a liquid inlet end of each of the second capillary micro channels, flows to the liquid outlet ends via the second capillary micro channels, and finally flows to the heat absorption tank again to realize circulating flow.

Alternatively, a material of the heat radiation working medium is selected from at least one of ethylene glycol, propylene glycol, or fluorinated liquid.

Alternatively, the heat-dissipating plate body includes:
a heat-dissipating base plate provided with a patterned groove;
a heat-dissipating cover plate packaged on a side of the heat-dissipating base plate provided with the patterned groove, and enclosing the patterned groove to form the heat-dissipating microcavity.

An embodiment of the present disclosure provides a display device including a display panel and a heat-dissipating plate, the heat-dissipating plate is mounted on the display panel.

Alternatively, the display panel includes a panel body and a driving chip bonded to the panel body, and an orthographic projection of the driving chip on the heat-dissipating plate is at least partially located in an area in which the heat absorption tank is disposed.

Alternatively, any one of the capillary micro channels includes a plurality of sub-flow-sections sequentially communicated with each other, each of the sub-flow-sections includes:
a main channel;
at least two branch channels, an end of each of the at least two branch channels independently abutting and communicating with an end of the main channel away from the liquid inlet end, and extending in a direction away from the main channel; and
a reservoir chamber abutting and communicating with an end of each of the at least two branch channels away from the main channel;
Wherein an inner diameter of each of the at least two branch channel is less than an inner diameter of the main channel.

Alternatively, each of the sub-flow-sections further includes an olive-type channel abutting and communicating with the end of the main channel away from the liquid inlet end, the olive-type channel is provided with one distributary island, the distributary island divides the olive-type channel into two branch channels and one reservoir chamber, and the two branch channels extend from an end of the distributary island adjacent to the main channel along edges of opposite sides of the distributary island to an end of the distributary island away from the main channel and communicate with the reservoir chamber.

Beneficial Effect

Embodiments of the present disclosure provide a heat-dissipating plate and a display, in the heat-dissipating plate, the heat absorption tank, the respective first capillary micro channels, the liquid collection tank, and the respective second capillary micro channels, which are arranged in communication with each other sequentially in the heat-dissipating microcavity, form a circulation, so that the heat dissipation working medium may circularly flow in the heat-dissipating microcavity to dissipate heat, thereby achieving high heat dissipation efficiency. Specifically, the heat absorption tank is arranged to be in contact with a heat source for absorbing heat emitted by the heat source, and the heat dissipation working medium in the heat absorption tank is subjected to a temperature rise after a large amount of heat is absorbed, so that the heat dissipation working medium is heated and partially gasified. The gaseous heat dissipation working medium diffuses to a liquid inlet end of each of the first capillary micro channels, and then the gaseous heat dissipation working medium entering the inside of each of the first capillary micro channels is condensed and converted into a liquid state, thereby forming a negative pressure in each of the first capillary micro channels. The liquid heat dissipation working medium existing in the heat dissipation tank is sucked into each of the first capillary micro channels by the negative pressure, and further, the heat dissipation working medium flows along each of the first capillary micro channels to the liquid collection tank by the combination of the surface tension of the liquid itself and the capillary action, heat of the heat dissipation working medium is continuously dissipated during the flowing process, and the liquid collection tank collects the heat dissipation working medium cooled through each of the first capillary micro channels. As the heat dissipation working medium in the liquid collection tank accumulates more and more, the heat dissipation working medium inevitably flows to the liquid inlet end of each of the second capillary micro channels. Under the capillary action formed by the second capillary micro channels, the heat dissipation working medium flows along each of the second capillary micro channels and further dissipates heat during the flowing process, and finally returns to the heat absorption tank at a lower temperature to form a self-circulating heat dissipation system, thereby achieving high heat dissipation efficiency.

BRIEF DESCRIPTION OF THE DRAWINGS

Technical solutions and other beneficial effects of the present disclosure will be apparent from the following detailed description of specific embodiments thereof, taken in conjunction with the accompanying drawings.

DETAILED DESCRIPTION

Figure 1:
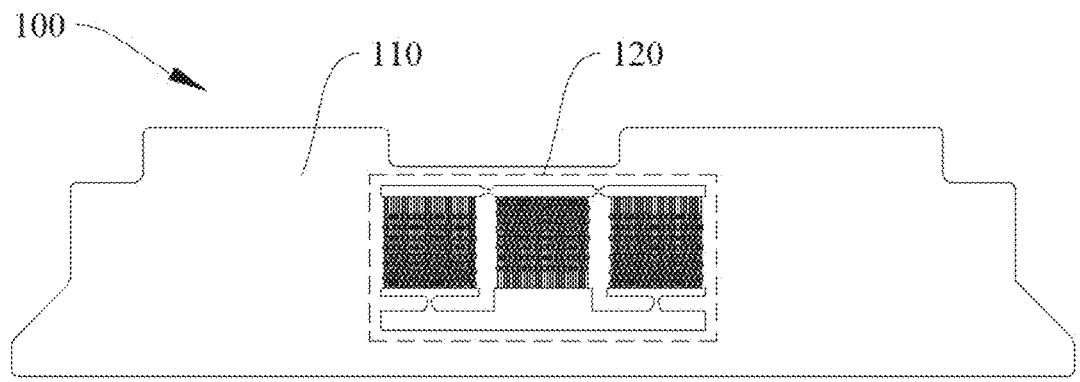
FIG. 1 is a schematic view of a plane structure of a heat-dissipating plate according to an embodiment of the present disclosure.

Technical solutions in embodiments of the present disclosure will be clearly and completely described below in conjunction with drawings in the embodiments of the present disclosure. Obviously, the described embodiments are only a part of embodiments of the present disclosure, rather than all the embodiments. Based on the embodiments in the present disclosure, all other embodiments obtained by those skilled in the art without creative work fall within the protection scope of the present disclosure.

In the description of the present disclosure, it should be understood that orientations or position relationships indicated by the terms "center", "longitudinal", "lateral", "length", "width", "thickness", "upper", "lower", "front", "rear", "left", "right", "vertical", "horizontal", "top", "bottom", "inside", "outside", and the like, are based on orientations or position relationships illustrated in the drawings. The terms are used to facilitate and simplify the description of the present disclosure, rather than indicate or imply that the devices or elements referred to herein are required to have specific orientations or be constructed or operate in the specific orientations. Accordingly, the terms should not be construed as limiting the present disclosure. In addition, the term "first", "second" are for illustrative purposes only and are not to be construed as indicating or imposing a relative importance or implicitly indicating the number of technical features indicated. Thus, a feature that limited by "first", "second" may expressly or implicitly include at least one of the features. In the description of the present disclosure, the meaning of "plural" is two or more, unless otherwise specifically defined.

In the present disclosure, the word "exemplary" is used to mean "serving as an example, illustration, or explanation". Any embodiment described as "exemplary" in the present disclosure is not necessarily construed as being more preferable or advantageous than other embodiments. In order to enable any person skilled in the art to implement and use the present disclosure, the following description is given. In the following description, the details are listed for the purpose of explanation. It should be understood that those of ordinary skill in the art can realize that the present disclosure can also be implemented without using these specific details. In other instances, well-known structures and processes will not be elaborated to avoid unnecessary details to obscure the description of the present disclosure. Therefore, the present disclosure is not intended to be limited to the illustrated embodiments, but is consistent with the widest scope that conforms to the principles and features disclosed in the present disclosure.

An embodiment of the present disclosure provides a heat-dissipating plate, which is described in detail below in connection with FIGS. 1 and 2.

Referring to FIG. 1, the heat-dissipating plate 100 includes a heat-dissipating plate body 110, a heat-dissipating microcavity 120, and a heat dissipation working medium.

The heat-dissipating microcavity 120 is embedded in the heat-dissipating plate body 110, and the heat dissipation working medium is filled in the heat-dissipating microcavity 120 and circularly flows in the heat-dissipating microcavity 120.

Figure 2:
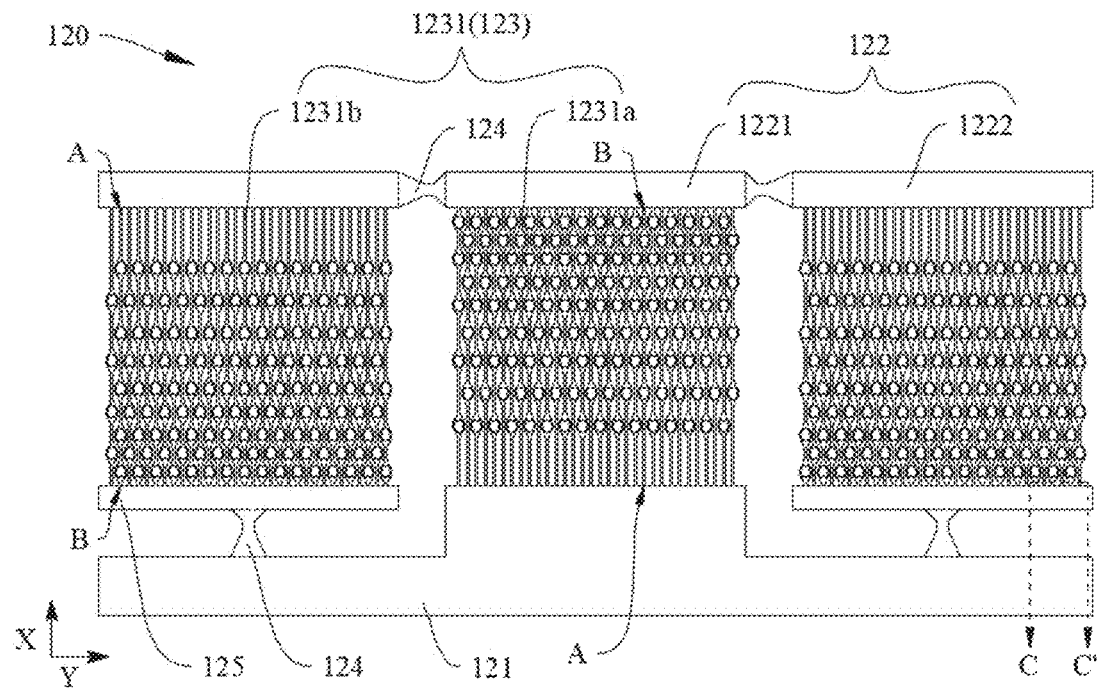
FIG. 2 is a schematic view of a plane structure of a heat-dissipating microcavity in a heat-dissipating plate according to an embodiment of the present disclosure.

Further, referring to FIG. 2, the heat-dissipating microcavity 120 includes a heat absorption tank 121, a liquid collection tank 122 disposed at intervals with the heat absorption tank 121, and a capillary micro channel (or runner) group 123 that is arranged between the heat absorption tank 121 and the liquid collection tank 122, and is adjacent to and communicates with the heat absorption tank 121 and the liquid collection tank 122. The capillary micro channel group 123 includes a plurality of capillary micro channels 1231 disposed at intervals, and the plurality of capillary micro channels 1231 includes a plurality of first capillary micro channels 1231a and a plurality of second capillary micro channels 1231b. Respective first capillary micro channels 1231a constitute a first capillary micro channel group, and respective second capillary micro channels constitute a second capillary micro channel group. A liquid inlet end A of any one of the first capillary micro channels 1231a is adjacent to and communicates with the heat absorption tank 121, and a liquid outlet end B thereof is adjacent to and communicates with the liquid collection tank 122. That is, the first capillary micro channel group is used to transmit the heat dissipation working medium from the heat absorption tank 121 to the liquid collection tank 122. A liquid inlet end A of any one of the second capillary micro channels 1231b is adjacent to and communicates with the liquid collection tank 122, and a liquid outlet end B thereof is adjacent to and communicates with the heat absorption tank 121. That is, the second capillary micro channel group is used to transmit the heat dissipation working medium from the liquid collection tank 122 to the heat absorption tank 121.

In the heat-dissipating plate according to the embodiment of the present disclosure, the heat absorption tank 121, the first capillary micro channels 1231a, the liquid collection tank 122, and the second capillary micro channels 1231b, which are provided in the heat-dissipating microcavity 120 and communicated with each other, form a circulation, so that the heat dissipation working medium may circularly flow in the heat-dissipating microcavity 120 to dissipate heat, thereby achieving high heat dissipation efficiency.

Specifically, the heat absorption tank 121 is arranged to be in contact with a heat source for absorbing heat emitted by the heat source, and the heat dissipation working medium in the heat absorption tank 121 increases in temperature after a large amount of heat is absorbed, so that thermal movement of the heat dissipation working medium is intensified and the heat dissipation working medium is partially vaporized. The gaseous heat dissipation working medium diffuses to the liquid inlet end A of each of the first capillary micro channels 1231a, and then the gaseous heat dissipation working medium entering the inside of each of the first capillary micro channels 1231a is condensed and converted into a liquid state, so that a negative pressure is formed in each of the first capillary micro channels 1231a, and the liquid heat dissipation working medium existing in the heat absorption tank 121 is sucked into each of the first capillary micro channels 1231a under the action of the negative pressure. Further, under the action of the surface tension of the liquid itself and the capillary action, the heat dissipation working medium flows along each of the first capillary micro channels 1231a to the liquid collection tank 122, and heat of the heat dissipation working medium is continuously dissipated during the flowing process. The liquid collection tank 122 collects the heat dissipation working medium cooled through each of the first capillary micro channels 1231a. As the heat dissipation working medium in the liquid collection tank 122 accumulates more and more, the heat dissipation working medium inevitably flows to the liquid inlet end A of each of the second capillary micro channels 1231b. Under the capillary action formed by each of the second capillary micro channels 1231b, the heat dissipation working medium flows along each of the second capillary micro channels 1231b and further dissipates heat during the flowing process, and the heat dissipation working medium finally returns to the heat absorption tank 121 at a lower temperature, thereby constituting a self-circulating heat-dissipating system, and achieving high heat dissipation efficiency.

In the heat-dissipating plate provided in an embodiment of the present disclosure, the capillary micro channel 1231 may be understood as a channel having a tiny inner diameter, in particular, the inner diameter is generally less than or equal to 1 mm, the capillary phenomenon formed by the capillary micro channel may be understood as a phenomenon in which due to the difference in cohesion and adhesion in the channel having a sufficiently small tube diameter, the liquid level of the immersion liquid overcomes gravity or other resistance and is spontaneously raised, and the capillary action is formed by a combination of surface tension, gravity and adhesion of the liquid.

In some embodiments, the longer the length of the capillary micro channel 1231, the more heat is dissipated after the heat dissipation working medium flows through the capillary micro channel 1231, and thus the heat-dissipating plate has better heat dissipation efficiency. However, when the capillary micro channel 1231 is too long, it is difficult for the heat dissipation working medium to flow through the capillary micro channel 1231, thereby slowing or even stopping the process of circulating heat dissipation.

Therefore, in this embodiment, the structure of the capillary micro channel 1231 is specially designed so that, with a certain length, the capillary micro channel 1231 may still provide sufficient power for the flow of the heat dissipation working medium therein, thereby ensuring an efficient self-circulating heat dissipation process, as described in detail below in connection with FIGS. 3 and 4.

Figure 3:
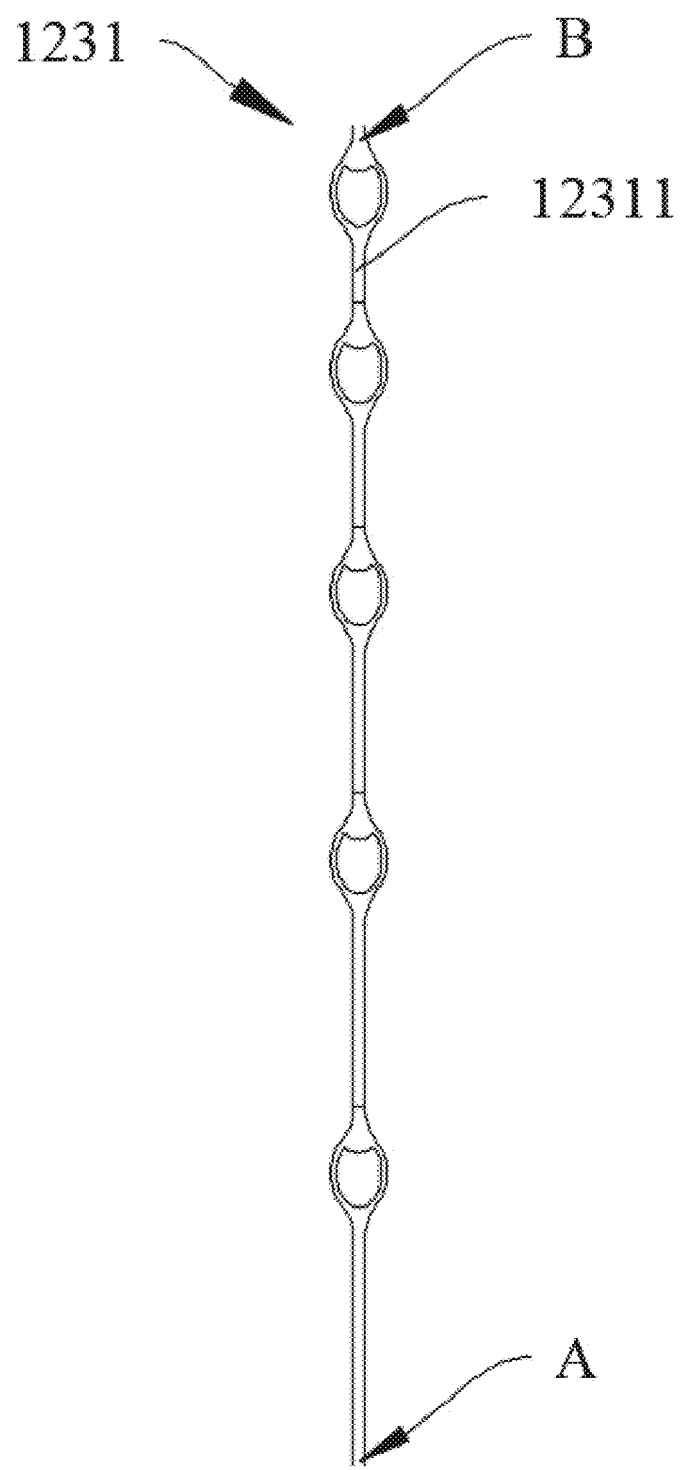
FIG. 3 is a schematic structural view of a capillary micro channel in a heat-dissipating plate according to an embodiment of the present disclosure.

Referring to FIG. 3, any of the capillary micro channels 1231 includes a plurality of sub-flow-sections 12311 communicating in sequence.

Figure 4:
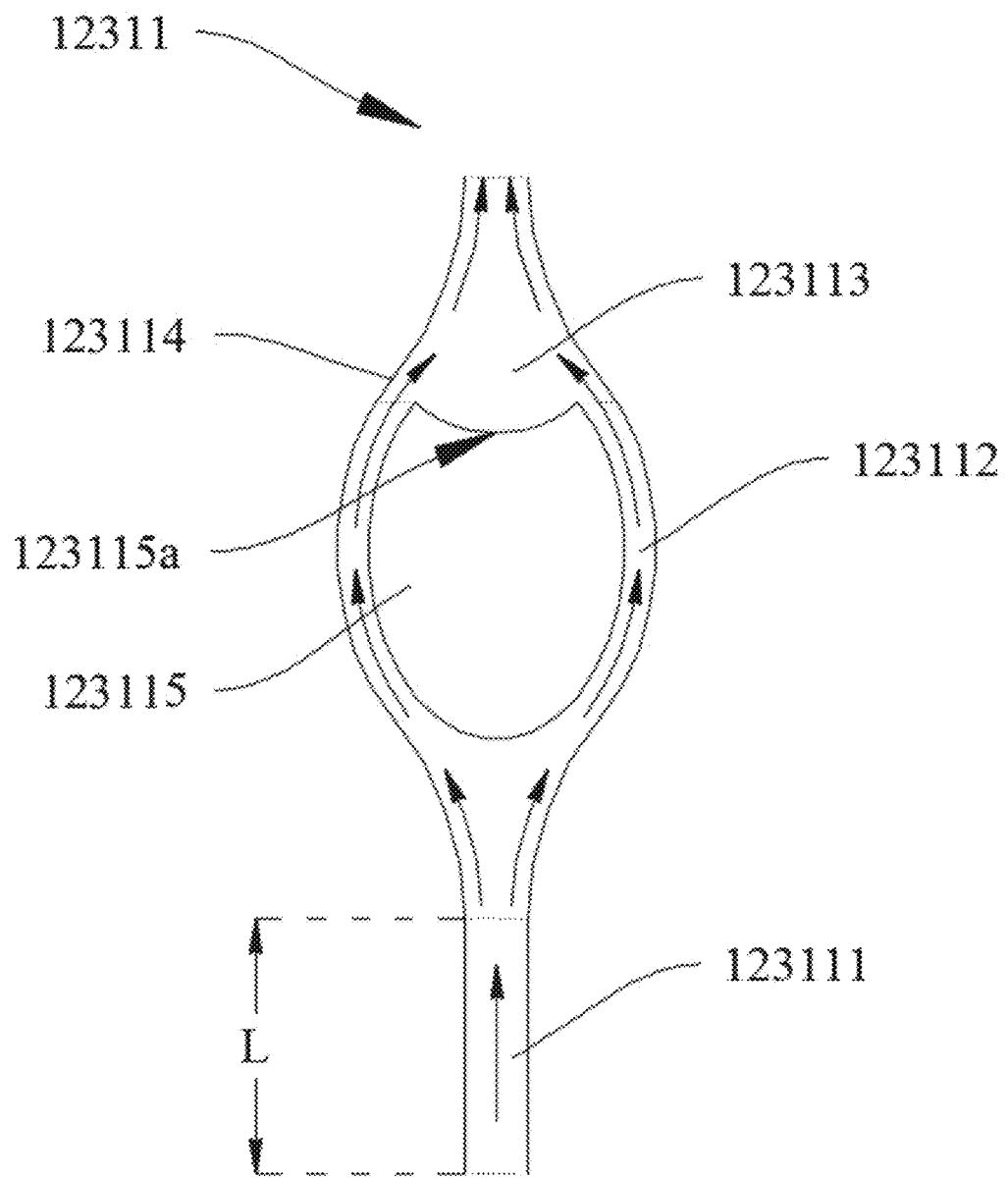
FIG. 4 is a schematic structural view of a sub-flow-section of a capillary micro channel in a heat-dissipating plate according to an embodiment of the present disclosure.

Referring to FIG. 4, a sub-flow-section 12311 includes a main channel 123111, at least two branch channels 123112, and a reservoir chamber 123113, which are communicated sequentially.

One end of each of the branch channels 123112 independently abuts and communicates with an end of the main channel 123111 away from the liquid inlet end A, and extends in a direction away from the main channel 123111, and an inner diameter of the branch channel 123112 is less than an inner diameter of the main channel 123111. The reservoir chamber 123113 abuts and communicates with an end of each of the branch channels 123112 away from the main channel 123111.

In two adjacent sub-flow-sections 12311, the reservoir chamber 123113 in a previous sub-flow-section 12311 is in abutment and communication with the main channel 123111 in a subsequent sub-flow-section 12311, and in this way, the sub-flow-sections 12311 are communicated sequentially.

For each of the sub-flow-sections 12311, the heat dissipation working medium flows first into the main channel 123111 and rapidly fills the whole main channel 123111 under the combined action of the surface tension of the liquid itself and the microporous capillary diversion. However, under the action of gravity and other resistance, the flow power of the heat dissipation working medium decays along the flow path. When the heat dissipation working medium flows to the end of the main channel 123112 adjacent to the branch channels 123112, the capillary action is strengthened due to the reduction of the inner diameter of each of the branch channels 123112 communicated with main channel 123112, and under the action of the surface tension of the liquid, the heat dissipation working medium continues to flow along each of the branch channels 123112 until it is collected in the reservoir chamber 123113. When the heat dissipation working medium in the reservoir chamber 123113 is collected to a certain amount, the heat dissipation working medium in the reservoir chamber 123113 enters the main channel of the next sub-flow-section 12311 and continues to flow under the capillary action. This enables the heat dissipation working medium to continue to flow throughout the capillary micro channel 1231 until it reaches the liquid outlet end B of the capillary micro channel 1231.

It should be noted that the inner diameter of the branch channel 123112 is less than the inner diameter of the main channel 123111 may be understood as an area of the cross-section of the branch channel 123112 perpendicular to the flow direction is less than an area of the cross-section of the main channel 123111 perpendicular to the flow direction, and the ratio of the cross-sectional area of the branch channel 123112 to the cross-sectional area of the main channel 123111 is (0.4-0.6):1.

In some embodiments, the cross-sectional shapes of the branch channel 123112 and the main channel 123111 in the flow direction are circular, elliptical, rectangular, or trapezoidal.

In some embodiments, the cross-sectional shapes of the branch channel 123112 and the main channel 123111 in the flow direction are rectangular, the width of the branch channel 123112 is less than the width of the main channel 123111, and the depth of the branch channel 123112 is equal to the depth of the main channel 123111.

In some embodiments, the ratio of the width of the branch channel 123112 to the width of the main channel 123111 is in the range (0.4-0.6):1.

In some embodiments, the width of the main channel 123111 is set to 20-30 um, and correspondingly, the width of the branch channel 123112 is set to 8-18 um.

In some embodiments, referring to FIG. 4, one sub-flow-section 12311 includes the main channel 123111 and an olive-type channel 123114 adjacent to and in communication with an end of the main channel 123111 away from the liquid inlet end A. The olive-type channel 123114 is provided with a distributary island 123115 and has an olive-shape orthographic projection on the heat-dissipating plate body, and the distributary island 123115 has an elliptical orthographic projection on the heat-dissipating plate body. The distributary island 123115 divides the olive-type channel 123114 into two branch channels 123112 and one reservoir chamber 123113. The two branch channels 123112 extend from one end of the distributary island 123115 adjacent to the main channel 123111 along edges of opposite sides of the distributary island 123115 to one end of the distributary island 123115 away from the main channel 123111, and the two branch channels 123112 abut and communicates with the reservoir chamber 123113. In this manner, the two branch channels 123112 have a streamline shape, thereby significantly reducing the resistance to the flow of the heat dissipation working medium inside the branch channels 123112, and ensuring that the heat dissipation working medium has a continuously sufficient flow power in the capillary micro channels 1231.

In some embodiments, during the flow of the heat dissipation working medium in the capillary micro channel 1231, due to the action of gravity and other resistances, there may be a phenomenon of power attenuation with the increase of the length of the flow path. In order to avoid the problem that the flow rate is too slow due to the insufficient power during the flow, the main channel closer to the liquid inlet end is designed to be longer, and the main channel farther away from the liquid inlet end is designed to be shorter. Specifically, referring to FIGS. 3 and 4, in any one of the capillary micro channels 1231, lengths L of the main channels 123111 decrease gradually in a direction from the liquid inlet end A toward the liquid outlet end B, and it is ensured that sufficient power is maintained during the flow of the entire capillary micro channel 1231 through sequentially decreasing the lengths of the main channels 123111, thereby forming an active self-circulating heat-dissipating effect, and greatly improving the heat dissipation efficiency.

In some embodiments, referring to FIG. 4, in one sub-flow-section 12311, one end of the distributary island 123115 adjacent to the reservoir chamber 123113 has a concave portion 123115a recessed toward a main channel side, and the concave portion 123115a has an arc-shaped edge recessed toward the main channel side, so that this structure may effectively suppress the reverse flow of the heat dissipation working medium existing in the capillary micro channel 1231. A plurality of distributary islands 123115 having the concave portions 123115a are sequentially provided in one of the capillary micro channels, and under the action of the plurality of distributary islands 123115 to jointly suppress reverse crosstalk, the heat dissipation working medium in each of the main channels 123111 is sequentially blocked resulting in the inability to reverse flow, thereby forming a unidirectional flow effect.

Figure 5:
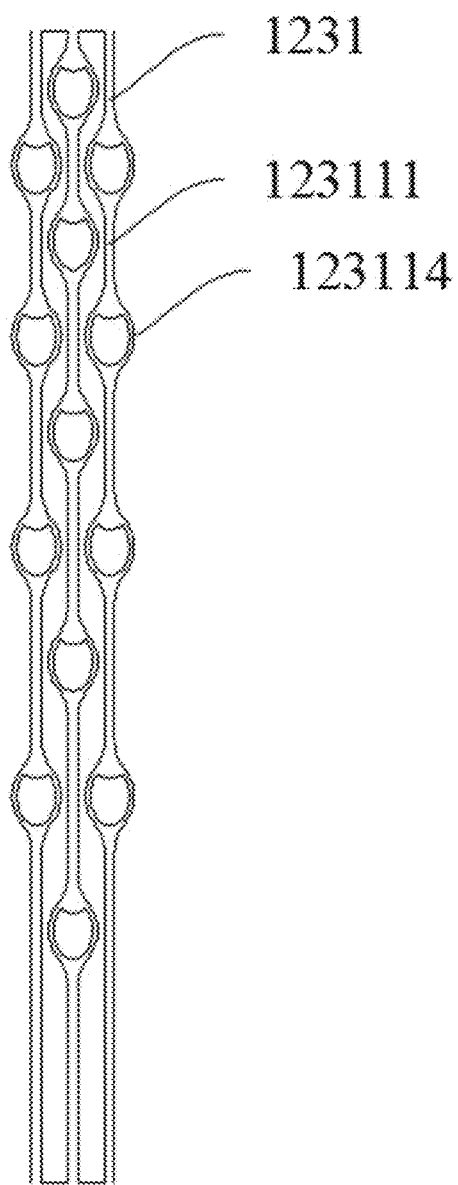
FIG. 5 is a schematic view of a distribution structure of adjacent capillary micro channels in a heat-dissipating plate according to an embodiment of the present disclosure.

In some embodiments, referring to FIGS. 2 and 5, in two adjacent capillary micro channels 1231, the olive-type channels 123114 in one of the capillary micro channels 1231 and the olive-type channels 123114 in the other of the capillary micro channels 1231 are arranged in a staggered manner. Specifically, the olive-type channels 123114 in one of the capillary micro channels 1231 and the main channels 123111 in the other of the capillary micro channels 1231 are provided in correspondence with each other so as to increase the number of the capillary micro channels 1231 arranged per unit area, thereby improving the heat dissipation efficiency of the heat-dissipating plate 100.

In some embodiments, referring to FIG. 2, any one of the capillary micro channels 1231 is provided extending in a first direction X, and the capillary micro channels 1231 are sequentially arranged at intervals in a second direction Y, and the first direction X is at a predetermined angle to the second direction Y.

In some embodiments, the first direction X is perpendicular to the second direction Y.

In some embodiments, the first capillary micro channels 1231a are sequentially adjacent and arranged at intervals in the second direction Y to form a first capillary micro channel group, and the second capillary micro channels 1231b are sequentially adjacent and arranged at intervals in the second direction Y to form a second capillary micro channel group, that is, the first capillary micro channels 1231a and the second capillary micro channels 1231b are arranged in separate regions to avoid crosstalk of the heat dissipation working medium during the flow.

In some embodiments, the liquid collection tank 122 includes a first liquid collection tank 1221 and a second liquid collection tank 1222 spaced apart from the first liquid collection tank 1221 in the second direction Y, the first liquid collection tank 1221 abuts and communicates with a liquid outlet end B of each of the first capillary micro channels 1231a, the second liquid collection tank 1222 abuts and communicates with a liquid inlet end A of each of the second capillary micro channels 1231b, and the first liquid collection tank 1221 and the second liquid collection tank 1222 communicate with each other via a connecting tube 124.

Figure 6:
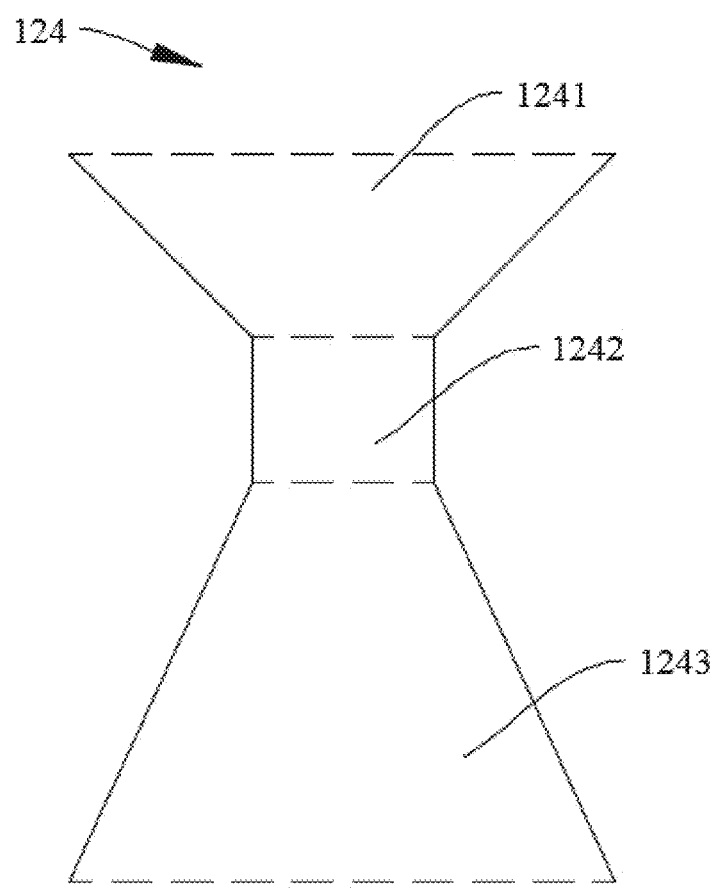
FIG. 6 is a schematic structural view of a connecting tube in a heat-dissipating plate according to an embodiment of the present disclosure.

Specifically, the connecting tube 124 is a tube that first shrinks and then expands, and accelerates the fluid according to the principle that the flow rate of the fluid is inversely proportional to the flow area. Referring to FIG. 6, the connecting tube 124 includes a first connecting sub-tube 1241, a second connecting sub-tube 1243, and a third connecting sub-tube 1242 located between and communicated with the first connecting sub-tube 1241 and the second connecting sub-tube 1243. In a direction from the first connecting sub-tube 1241 to the second connecting sub-tube 1243, the inner diameter of the first connecting sub-tube 1241 decreases gradually, the inner diameter of the second connecting sub-tube 1243 gradually increases, the first connecting sub-tube 1241 abuts and communicates with the first liquid collection tank 1221, the second connecting sub-tube 1243 abuts and communicates with the second liquid collection tank 1222, and the flow rate of the heat dissipation working medium increases after flowing from the first liquid collection tank 1221 to the second liquid collection tank 1222 via the connecting tube 124.

In a specific heat dissipation process, a heat dissipation working medium flows into the first liquid collection tank 1221 through each of the first capillary micro channels 1231a and is continuously collected. When the heat dissipation working medium inside the first liquid collection tank 1221 is collected to a certain amount, the heat dissipation working medium accelerates to flow into each of the second liquid collection tank 1222 under the acceleration of the connecting tube 124, and the heat dissipation working medium having a higher flow rate further flows to the liquid inlet end A of each of the second capillary micro channels 1231b. Similarly, under the capillary action formed by each of the second capillary micro channels 1231b, the heat dissipation working medium flows continuously along each of the second capillary micro channels 1231b and further dissipates heat during the flow process, and finally returns to the heat absorption tank 121 to form a circulating heat-dissipating system.

In this embodiment, by providing the connecting tube 124, on the one hand, the circulating flow efficiency of the heat dissipation working medium in the heat-dissipating microcavity 120 is improved by accelerating the heat dissipation working medium flowing through the connecting tube 124, thereby improving the heat dissipating efficiency of the heat-dissipating plate 100. On the other hand, because the flow rate of the heat dissipation working medium increases when the heat dissipation working medium flows from the first liquid collection tank 1221 to the second liquid collection tank 1222, the reverse flow of the heat dissipation working medium from the second liquid collection tank 1222 to the first liquid collection tank 1221 is effectively suppressed under the inertia action of the heat dissipation working medium, and the circulating flow efficiency of the heat dissipation working medium in the heat-dissipating microcavity 120 is further improved.

It should be noted that the first liquid collection tank 1221 and the second liquid collection tank 1222 communicate with each other through one connecting tube 124, or the first liquid collection tank 1221 and the second liquid collection tank 1222 communicate with each other through a plurality of the connecting tubes 124, which is set according to specific process requirements.

In some embodiments, the flow power of the heat dissipation working medium in the second capillary micro channel 1231b is necessarily less than the flow power in the first capillary micro channel 1231a due to the attenuation of the flow power caused by gravity or other resistance, and thus, the flow rate of the heat dissipation working medium in the second capillary micro channel 1231b is less than the flow rate in the first capillary micro channel 1231a. In order to balance the volume of the heat dissipation working medium flowing from the heat absorption tank 121 through each of the first capillary micro channels 1231a to the liquid collection tank 122 with the volume of the heat dissipation working medium flowing from the liquid collection tank 122 through each of the second capillary micro channels 1231b back to the heat absorption tank 121, the number of the second capillary micro channels 1231b is greater than the number of the first capillary micro channels 1231a, specifically, the number of the second capillary micro channels 1231b is 1 to 2 times the number of the first capillary micro channels 1231a.

In some embodiments, referring to FIG. 2, the liquid collection tank 122 includes one first liquid collection tank 1221 and two second liquid collection tanks 1222, one of the second liquid collection tanks 1222 is located at one end of the first liquid collection tank 1221 in the second direction Y, and the other of the second liquid collection tanks 1222 is located at one end of the first liquid collection tank 1221 in the opposite direction of the second direction Y. The one of the second liquid collection tank 1222 abuts and communicates with liquid inlet ends A of a part of the second capillary micro channels 1231b, and the other of the second liquid collection tanks 1222 abuts and communicates with liquid inlet ends A of a remaining part of the second capillary micro channels 1231b, such that the heat dissipation working fluid collected by the first liquid collection tank 1221 may flow to the second liquid collection tanks 1222 on both sides of the first liquid collection tank 1221 at the same time, respectively, and further flows back to the heat absorption tank 121 through the second capillary micro channels 1231b corresponding to the two second liquid collection tanks 1222. As a result, the circulating flow efficiency of the heat dissipation working medium in the heat-dissipating microcavity 120 is further improved, and the heat dissipation efficiency of the heat-dissipating plate 100 is further improved.

In some embodiments, the heat-dissipating microcavity 120 further includes a buffer tank 125 disposed between the liquid outlet end B of each of the second capillary micro channels 1231b and the heat absorption tank 121, one end of the buffer tank 125 abuts and communicates with the liquid outlet end B of each of the second capillary micro channels 1231b, and the other end of the buffer tank 125 communicates with the heat absorption tank 121 through a connecting tube 124. The buffer tank 125 abuts and communicates with the first connecting sub-tube 1241, and the heat absorption tank 121 abuts and communicates with the second connecting sub-tube 1243.

By adding the buffer tank 125 and the connecting tube 124 between the second capillary micro channels 1231b and the heat absorption tank 121, the heat dissipation working medium flows out from the liquid outlet end B of each of the second capillary micro channels 1231b, then enters the buffer tank 125, and are continuously collected. When the heat dissipation working medium in the buffer tank 125 are collected to a certain amount, the heat dissipation working medium may inevitably flow to the connecting tube 124, the flow rate of the heat dissipation working medium is increased after passing through the connecting tube 124, and the heat dissipation working medium returns to the heat absorption tank 121 at a higher flow rate, so that the circulating heat dissipation is realized, which is advantageous for further improving the circulating flow efficiency of the heat dissipation working medium in the heat-dissipating microcavity 120, thereby improving the heat dissipation efficiency of the heat-dissipating plate 100.

Further, the heat-dissipating microcavity 120 includes two buffer tanks 125, which are provided in correspondence with the two second liquid collection tanks 1222, that is, one of the buffer tanks 125 communicates with one of the second liquid collection tanks 1222 through corresponding second capillary micro channels 1231b, and the other of the buffer tanks 125 communicates with the other of the second liquid collection tanks 1222 through corresponding second capillary micro channels 1231b.

It should be noted that the buffer tank 125 communicates with the heat absorption tank 121 through one connecting tube 124, or the buffer tank 125 communicates with the heat absorption tank 121 through a plurality of connecting tubes 124, which is set according to a specific process requirement.

In some embodiments, the material of the heat dissipation working medium is specifically selected to have a high specific heat capacity value, so that the temperature of the heat dissipation working medium is not too high when absorbing a large amount of heat. The heat dissipation working medium usually includes the material with a specific heat capacity value greater than 4000 J/kg·° C. For example, the heat dissipation working medium is selected from at least one of ethylene glycol, propylene glycol, or a fluorinated liquid.

In some embodiments, the material of the heat-dissipating plate body is selected from aluminum alloy, copper, stainless steel, titanium alloy, or the like.

Figure 7:
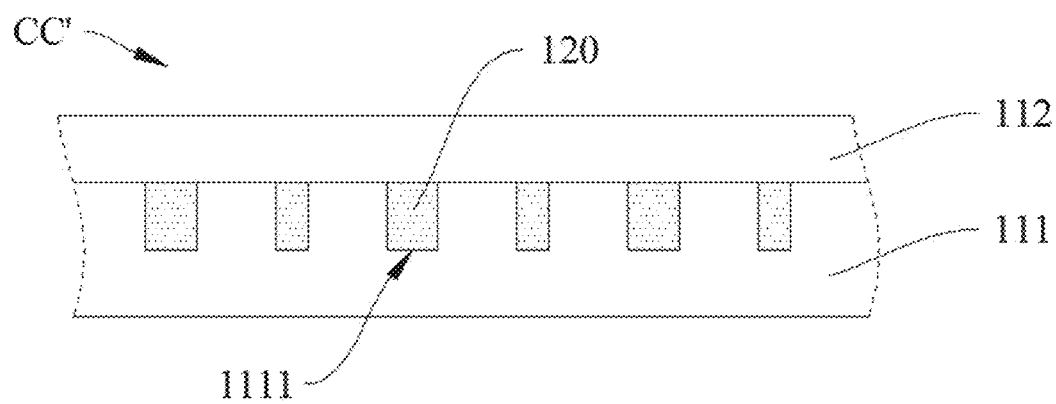
FIG. 7 is a schematic cross-sectional view at a position of CC' in FIG. 2.

In some embodiments, referring to the cross-sectional structure at the position of CC' in FIG. 2 shown in FIG. 7, the heat-dissipating plate body includes a heat-dissipating base plate 111 and a heat-dissipating cover plate 112 disposed on the heat-dissipating base plate 111.

One side of the heat-dissipating base plate 111 is provided with one or more patterned grooves 1111, and the heat-dissipating cover plate 112 seals one side of the heat-dissipating base plate 111 on which the patterned grooves 1111 are provided, and encloses the patterned grooves to form the heat-dissipating microcavity 120.

In some embodiments, the patterned grooves 1111 on the heat-dissipating base plate 111 are formed by a chemical etching process or by a laser engraving process, and the heat-dissipating cover plate 112 is encapsulated on the heat-dissipating base plate 111 by a friction stir welding process or a mechanical structure adhesive bonding process to form a closed heat-dissipating microcavity 120.

In some embodiments, the depth of the patterned groove 1111 ranges from 10 to 100 μm, for example, the depth of the patterned groove is 50 μm, and correspondingly, the thickness of the heat-dissipating base plate 111 is set to 100 μm, and the thickness of the heat-dissipating cover plate 112 is set to 100 μm.

Another embodiment of the present disclosure further provides a display device including a display panel and the heat-dissipating plate provided in the above embodiment, the heat-dissipating plate is mounted on the display panel.

According to the display device provided in the present embodiment, the heat-dissipating plate provided in the above embodiment has a high heat dissipation efficiency due to its special structural design, and is assembled with the display panel, so that heat generated when the display panel works may be effectively dissipated, thereby ensuring that the display panel is always in a low temperature environment.

In some embodiments, the display panel includes a panel body and a driving chip attached to the panel body, and the heat absorption tank in the heat-dissipating plate is disposed corresponding to the driving chip.

In the display device according to the present embodiment, since the driving chip is the element that generates the most heat in the display device, the heat absorption tank is further provided corresponding to the driving chip, thereby effectively dissipating the heat generated when the driving chip works, and preventing the heat of the driving chip from being transferred to the inside of the panel main body resulting in poor display.

Figure 8:
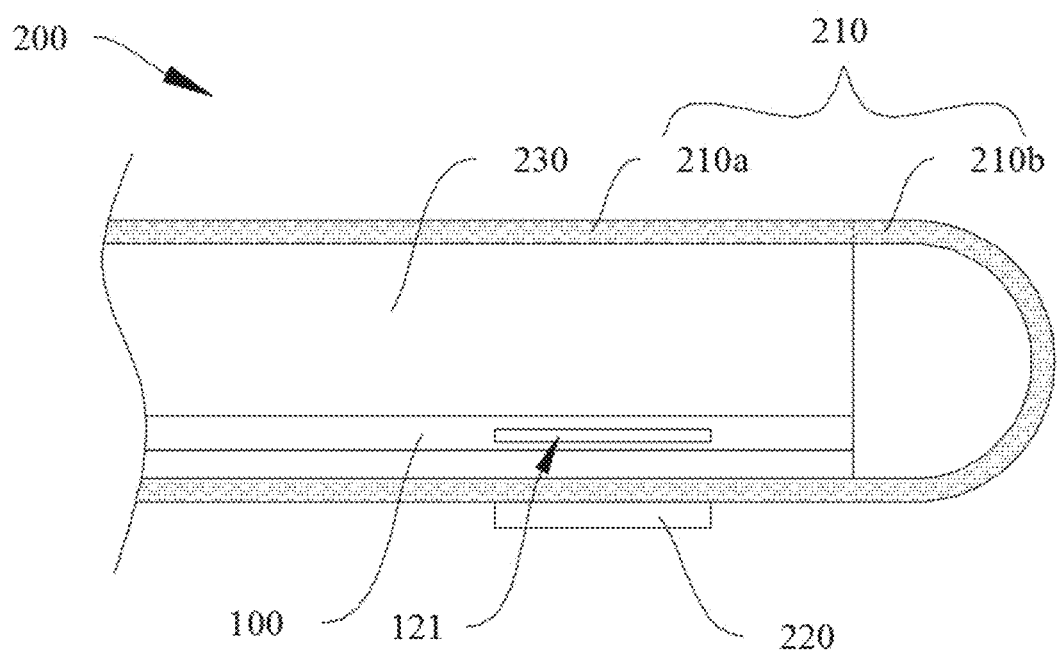
FIG. 8 is a schematic cross-sectional view of a display device according to the present disclosure.

In the following, a specific assembling method is described by way of example with reference to FIG. 8. The display device 200 includes a panel main body 210, a driving chip 220, and a supporting layer 230, the panel main body 210 includes a display portion 210a and a bending portion 210b connected to the display portion 210a, the driving chip 220 is bonded to the bending portion 210b, and the bending portion 210b and the driving chip 220 are bent toward the rear surface of the display portion 210a and fixed to the rear surface of the display portion 210a by the supporting layer 230. The heat-dissipating plate 100 is embedded in the supporting layer 230, and generally, the heat-dissipating plate 100 is embedded in an area of the supporting layer 230 close to the driving chip 220. Further, the heat absorption tank 121 in the heat-dissipating plate 100 is provided corresponding to the driving chip 220, that is, an orthographic projection of the driving chip 220 on the heat-dissipating plate 100 is at least partially located in an area in which the heat absorption tank is located.

In some embodiments, the supporting layer 230 includes a first back plate, a stainless steel layer, a black polyimide layer, and a second back plate, which are stacked. In order to place the heat-dissipating plate 100 adjacent to the driving chip 220, only the first back plate in the supporting layer 230 is disposed at a side of the heat-dissipating plate 100 adjacent to the driving chip 220, and the stainless steel layer, the black polyimide layer, and the second back plate in the supporting layer 230 are disposed at the side of the heat-dissipating plate 100 away from the driving chip 220.

The heat-dissipating plates and display devices according to embodiments of the present disclosure have been described in detail. The principles and embodiments of the present disclosure have been described with reference to specific embodiments, and the description of the above embodiments is merely intended to aid in the understanding of the method of the present disclosure and its core idea. At the same time, changes may be made by those skilled in the art to both the specific implementations and the scope of application in accordance with the teachings of the present disclosure. In view of the foregoing, the content of the present specification should not be construed as limiting the disclosure.

What is claimed is:

1. A heat-dissipating plate, wherein the heat-dissipating plate comprises:
a heat-dissipating plate body;
a heat-dissipating microcavity embedded in the heat-dissipating plate body; and
a heat dissipation working medium filled in the heat-dissipating microcavity;
wherein the heat-dissipating microcavity comprises a heat absorption tank, a liquid collection tank arranged at an interval with the heat absorption tank, and a capillary micro channel group between the heat absorption tank and the liquid collection tank and communicating with the heat absorption tank and the liquid collection tank, the capillary micro channel group comprises a plurality of capillary micro channels arranged at intervals, the plurality of capillary micro channels comprises a plurality of first capillary micro channels and a plurality of second capillary micro channels, the first capillary micro channels constitute a first capillary micro channel group, the second capillary micro channels constitute a second capillary micro channel group, a liquid inlet end of each of the first capillary micro channels abuts and communicates with the heat absorption tank, a liquid outlet end of each of the first capillary micro channels abuts and communicates with the liquid collection tank, a liquid inlet end of each of the second capillary micro channels abuts and communicates with the liquid collection tank, and a liquid outlet end of each of the second capillary micro channels abuts and communicates with the heat absorption tank; and wherein each of the plurality of first capillary micro channels and each of the plurality of second capillary micro channels comprises a plurality of sub-flow-sections sequentially communicated with each other, each of the sub-flow-sections comprises:

a main channel;

at least two branch channels, an upstream end of each of the at least two branch channels independently abutting and communicating with a downstream end of the main channel away from the liquid inlet end of each of the first and second capillary microchannels, and extending in a direction away from the main channel; and a reservoir chamber abutting and communicating with a downstream end of each of the at least two branch channels away from the main channel;

wherein an inner diameter of each of the at least two branch channel is less than an inner diameter of the main channel.

2. The heat-dissipating plate according to claim 1, wherein in two adjacent sub-flow-sections of the plurality of sub-flow-sections, the reservoir chamber of one of the two adjacent sub-flow-sections abuts and communicates with the main channel of another of the two adjacent sub-flow-sections.

3. The heat-dissipating plate according to claim 1, wherein a ratio of a cross-sectional area of each of the at least two branch channels to a cross-sectional area of the main channel is (0.4-0.6):1.

4. The heat-dissipating plate according to claim 1, wherein each of the sub-flow-sections further comprises the reservoir chamber and an olive-type channel abutting and communicating with the downstream end of the main channel away from the liquid inlet end, the olive-type channel is provided with a distributary island, the distributary island divides the olive-type channel into two branch channels of the least two branch channels, and the two branch channels extend from an upstream end of the distributary island adjacent to the main channel along edges of opposite sides of the distributary island to a downstream end of the distributary island away from the main channel and communicate with the reservoir chamber.

5. The heat-dissipating plate according to claim 1, wherein in each of the capillary micro channels, lengths of the main channels decrease gradually in a direction from the liquid inlet end toward the liquid outlet end.

6. The heat-dissipating plate according to claim 4, wherein in each of the sub-flow-sections, the downstream end of the distributary island away from the main channel has a concave portion recessed toward the main channel.

7. The heat-dissipating plate according to claim 4, wherein in two adjacent capillary micro channels of the plurality of capillary micro channels, each olive-type channel in one of the two adjacent capillary micro channels and each olive-type channel in another of the two adjacent capillary micro channels are sequentially arranged in a staggered manner.

8. The heat-dissipating plate according to claim 1, wherein each of the plurality of first capillary micro channels extends in a first direction, each of the plurality of second capillary micro channels extends in the first direction, the plurality of first capillary micro channels is sequentially arranged at intervals in a second direction, the plurality of second capillary micro channels is sequentially arranged at intervals in the second direction, and the first direction is at a predetermined angle to the second direction.

9. The heat-dissipating plate according to claim 8, wherein the liquid collection tank comprises a first liquid collection tank and a second liquid collection tank spaced apart from the first liquid collection tank in the second direction, the first liquid collection tank abuts and communicates with the liquid outlet end of each of the first capillary micro channels, the second liquid collection tank abuts and communicates with the liquid inlet end of each of the second capillary micro channels, wherein the heat-dissipating microcavity further comprises at least one a connecting tube, the connecting tube comprises a first connecting sub-tube and a second connecting sub-tube in communication with each other, an inner diameter of the first connecting sub-tube decreases gradually and an inner diameter of the second connecting sub-tube increases gradually along a direction from the first connecting sub-tube toward the second connecting sub-tube, the first liquid collection tank and the second liquid collection tank communicates with each other through the connecting tube, the first liquid collection tank abuts and communicates with the first connecting sub-tube, and the second liquid collection tank abuts and communicates with the second connecting sub-tube.

10. The heat-dissipating plate according to claim 9, wherein a number of the second capillary micro channels is greater than a number of the first capillary micro channels.

11. The heat-dissipating plate according to claim 9, wherein the liquid collection tank includes one first liquid collection tank and two second liquid collection tanks, the two second liquid collection tanks are located at both ends of the first liquid collection tank respectively, one of the two second liquid collection tanks abuts and communicates with a part of the second capillary micro channels, and another of the two second liquid collection tanks abuts and communicates with a remaining part of the second capillary micro channels.

12. The heat-dissipating plate according to claim 1, wherein the heat-dissipating microcavity further comprises a buffer tank disposed between a liquid outlet end of each of the second capillary micro channels and the heat absorption tank, one end of the buffer tank abuts and communicates with the liquid outlet end of each of the second capillary micro channels, another end of the buffer tank communicates with the heat absorption tank through a connecting tube.

13. The heat-dissipating plate according to claim 1, wherein the heat dissipation working medium diffuses to the liquid inlet end of each of the first capillary micro channels after absorbing heat in the heat absorption tank, flows to the liquid outlet ends of each of the first capillary micro channels, and is collected in the liquid collection tank, and the heat dissipation working medium collected in the liquid collection tank flows to the liquid inlet end of each of the second capillary micro channels, flows to the liquid outlet ends of each of the second capillary micro channels, and finally flows to the heat absorption tank again to realize circulating flow.

14. The heat-dissipating plate according to claim 1, wherein a material of the heat radiation working medium is selected from at least one of ethylene glycol, propylene glycol, or fluorinated liquid.

15. The heat-dissipating plate according to claim 1, wherein the heat-dissipating plate body comprises:
   a heat-dissipating base plate provided with a patterned groove; and
   a heat-dissipating cover plate packaged on a side of the heat-dissipating base plate provided with the patterned groove, and enclosing the patterned groove to form the heat-dissipating microcavity.

16. A display device comprising a display panel and a heat-dissipating plate, the heat-dissipating plate being mounted on the display panel, and the heat-dissipating plate comprising:
   a heat-dissipating plate body;
   a heat-dissipating microcavity embedded in the heat-dissipating plate body; and
   a heat dissipation working medium filled inside the heat-dissipating microcavity;
   wherein the heat-dissipating microcavity comprises a heat absorption tank, a liquid collection tank arranged at an interval with the heat absorption tank, and a capillary micro channel group between the heat absorption tank and the liquid collection tank and communicating with the heat absorption tank and the liquid collection tank, the capillary micro channel group comprises a plurality of capillary micro channels arranged at intervals, the plurality of capillary micro channels comprises a plurality of first capillary micro channels and a plurality of second capillary micro channels, the first capillary micro channels constitute a first capillary micro channel group, the second capillary micro channels constitute a second capillary micro channel group, a liquid inlet end of each of the first capillary micro channels abuts and communicates with the heat absorption tank, a liquid outlet end of each of the first capillary micro channels abuts and communicates with the liquid collection tank, a liquid inlet end of each of the second capillary micro channels abuts and communicates with the liquid collection tank, and a liquid outlet end of each of the second capillary micro channels abuts and communicates with the heat absorption tank; and
   wherein each of the plurality of first capillary micro channels and each of the plurality of second capillary micro channels comprises a plurality of sub-flow-sections sequentially communicated with each other, each of the sub-flow-sections comprises:
   a main channel;
   at least two branch channels, an upstream end of each of the at least two branch channels independently abutting and communicating with a downstream end of the main channel away from the liquid inlet end of each of the first and second capillary microchannels, and extending in a direction away from the main channel; and
   a reservoir chamber abutting and communicating with a downstream end of each of the at least two branch channels away from the main channel;
   wherein an inner diameter of each of the at least two branch channels is less than an inner diameter of the main channel.

17. The display device according to claim 16, wherein the display panel comprises a panel body and a driving chip bonded to the panel body, and an orthographic projection of the driving chip on the heat-dissipating plate is at least partially located in an area in which the heat absorption tank is disposed.

18. The display device according to claim 16, wherein each of the sub-flow-sections further comprises the reservoir chamber and an olive-type channel abutting and communicating with the downstream end of the main channel away from the liquid inlet end, the olive-type channel is provided with a distributary island, the distributary island divides the olive-type channel into two branch channels of the least two branch channels, and the two branch channels extend from an upstream end of the distributary island adjacent to the main channel along edges of opposite sides of the distributary island to a downstream end of the distributary island away from the main channel and communicate with the reservoir chamber.

19. A heat-dissipating plate, wherein the heat-dissipating plate comprises:
   a heat-dissipating plate body;
   a heat-dissipating microcavity embedded in the heat-dissipating plate body; and
   a heat dissipation working medium filled in the heat-dissipating microcavity;
   wherein the heat-dissipating microcavity comprises a heat absorption tank, a liquid collection tank arranged at an interval with the heat absorption tank, and a capillary micro channel group between the heat absorption tank and the liquid collection tank and communicating with the heat absorption tank and the liquid collection tank, the capillary micro channel group comprises a plurality of capillary micro channels arranged at intervals, the plurality of capillary micro channels comprises a plurality of first capillary micro channels and a plurality of second capillary micro channels, the first capillary micro channels constitute a first capillary micro channel group, the second capillary micro channels constitute a second capillary micro channel group, a liquid inlet end of each of the first capillary micro channels abuts and communicates with the heat absorption tank, a liquid outlet end of each of the first capillary micro channels abuts and communicates with the liquid collection tank, a liquid inlet end of each of the second capillary micro channels abuts and communicates with the liquid collection tank, and a liquid outlet end of each of the second capillary micro channels abuts and communicates with the heat absorption tank;
   wherein each of the plurality of first capillary micro channels extends in a first direction, each of the plurality of second capillary micro channels extends in the first direction, the plurality of first capillary micro channels is sequentially arranged at intervals in a second direction, the plurality of second capillary micro channels is sequentially arranged at intervals in the second direction, and the first direction is at a predetermined angle to the second direction; and
   wherein the liquid collection tank comprises a first liquid collection tank and a second liquid collection tank spaced apart from the first liquid collection tank in the second direction, the first liquid collection tank abuts and communicates with the liquid outlet end of each of the first capillary micro channels, the second liquid collection tank abuts and communicates with the liquid inlet end of each of the second capillary micro channels, wherein the heat-dissipating microcavity further comprises a connecting tube, the connecting tube comprises a first connecting sub-tube and a second connecting sub-tube in communication with each other, an inner diameter of the first connecting sub-tube decreases gradually and an inner diameter of the second connecting sub-tube increases gradually along a direction from the first connecting sub-tube toward the second connecting sub-tube, the first liquid collection tank and the second liquid collection tank communicates with each other through the connecting tube, the first liquid collection tank abuts and communicates with the first connecting sub-tube, and the second liquid collection tank abuts and communicates with the second connecting sub-tube.

20. The heat-dissipating plate according to claim 19, wherein a number of the second capillary micro channels is greater than a number of the first capillary micro channels.

\* \* \* \* \*